United States Patent [19]

Peak

[11] Patent Number: 4,725,772
[45] Date of Patent: Feb. 16, 1988

[54] ELECTRICAL CIRCUIT TESTER SELECTIVELY RESPONSIVE TO EITHER PRESENCE OR ABSENCE OF AC POWER

[76] Inventor: Rex W. Peak, 106 Randall Ave., Syracuse, N.Y. 13207

[21] Appl. No.: 364,359

[22] Filed: Apr. 1, 1982

[51] Int. Cl.[4] .................................................. G01R 19/145
[52] U.S. Cl. ..................................... 324/66; 324/133;
324/555; 324/508; 340/654
[58] Field of Search ................... 324/51, 133, 66, 149,
324/555, 508, 543; 340/654, 656

[56] References Cited

U.S. PATENT DOCUMENTS

| | | | |
|---|---|---|---|
| 3,416,074 | 12/1968 | Scheonover | 324/51 |
| 4,001,803 | 1/1977 | Lombardo | 340/656 |
| 4,015,201 | 3/1977 | Chaffee | 324/149 X |
| 4,027,236 | 5/1977 | Stewart | 324/51 |
| 4,041,380 | 8/1977 | Epstein | 324/51 |
| 4,097,843 | 6/1978 | Basile | 340/656 |
| 4,169,357 | 10/1979 | Kelley | 340/654 X |
| 4,176,315 | 11/1979 | Sunnarberg | 324/133 X |
| 4,233,560 | 11/1980 | Blenman | 324/133 |
| 4,259,635 | 3/1981 | Triplett | 324/149 |
| 4,356,442 | 10/1982 | Beha | 324/133 X |

FOREIGN PATENT DOCUMENTS 30686 11/1922 Fed. Rep. of Germany ........ 324/51

OTHER PUBLICATIONS

Todd, "A Sub-Ohm Continuity Tester" *Electronics World* Feb. 1969, pp. 78-80.

*Primary Examiner*—Reinhard J. Eisenzopf
*Assistant Examiner*—W. Edmonds
*Attorney, Agent, or Firm*—Charles S. McGuire

[57] ABSTRACT

A self-contained unit intended primarily for tracing the circuit connection between electrical outlets and a circuit-breaking connection thereof to an AC power source. The unit includes a housing containing batteries, a buzzer or other sound-producing means, an AC relay and a switch for selective placement in either of two positions. An electrical cord extends from the housing and terminates in a male plug for insertion in a receptacle of the circuit to be traced. By placing the switch in its first position the buzzer will sound when the AC power is supplied to the receptacle; placing the switch in its second position will cause the buzzer to sound when AC power, initially present, is removed from the receptacle. A second embodiment adds to the foregoing the capability of testing unpowered circuits for continuity between two conductors by incorporating an additional selectively positioned switch.

7 Claims, 2 Drawing Figures

ELECTRICAL CIRCUIT TESTER SELECTIVELY RESPONSIVE TO EITHER PRESENCE OR ABSENCE OF AC POWER

BACKGROUND OF THE INVENTION

The present invention relates to means for testing electrical circuits to determine in which of a plurality of pre-wired circuits a particular outlet or other circuit point is connected, and/or to determine whether there is electrical continuity between a pair of conductors.

In the service wiring of virtually any modern commercial or residential building, an incoming AC power line is connected to a fuse box or other circuit breaking means for protection in the event a circuit is loaded beyond a desired amperage. Normally the structure is wired with a plurality of separate, electrically distinct circuits each connected to a different fuse or circuit breaker. Each circuit may, and commonly does, include a number of receptacles or other outlets for selectively connecting the items to receive electrical power from the circuit.

Many situations arise which make it necessary to determine in which circuit a particular outlet is connected, where this is not otherwise indicated. This can be a very time-consuming operation, especially when it must be performed by one person working alone. In many cases the fuse box or circuit breakers will be located at a considerable distance from the outlet of the circuit being traced, often on a different floor of the building. Many trips back and forth between the outlet and fuse/breaker box may be required before the proper circuit is identified.

Another common situation which arises, for example, during wiring operations in building and elsewhere, is the need to determine whether two conductors are electrically connected. That is, it must be determined whether circuit continuity exists between two conductors where no external power is being provided thereto.

It is an object of the present invention to provide novel and improved apparatus for determining in which of a plurality of discrete electrical circuits a particular electrical outlet is connected.

A further object is to provide circuit tracing apparatus for connection to an existing outlet which will provide an audible indication to an operator at a remote location when electrical power is supplied to said outlet, when operated in a first mode, or when power is removed when operated in a second mode.

Another object is to provide circuit testing apparatus capable of providing an indication of which of a plurality of discrete circuits incorporate a particular outlet or other circuit point, and also of whether circuit continuity exists between two unpowered conductors.

Still another object is to provide apparatus of the character described which is small, lightweight, portable, inexpensive and simple in both construction and operation.

Other objects will in part be obvious and will in part appear hereinafter.

SUMMARY OF THE INVENTION

The foregoing objects are achieved by the present invention in a unit including a small housing (a few inches in height, width and depth) which encloses all of the electrical elements and has extending therefrom an electrical cord preferably terminating in a male plug. The elements include a DC power source, such as a 6 volt battery, a buzzer or other audible sound-producing means operable by the DC power source, an AC relay, at least one selectively positionable switch and suitable electrical connections thereof.

For circuit tracing, the switch is placed in a first position and the male plug inserted in a wall receptacle which is connected, through a fuse or circuit breaker, to the incoming AC line. Power thus provided to the unit closes the relay which connects the battery and buzzer through the switch and relay. Thus, the buzzer will sound until power is removed. The operator then proceeds to the fuse/breaker box, within hearing distance of the buzzer, and disconnects the fuse or breaker in a first circuit. If the buzzer continues, the first fuse or breaker is reconnected and that of a second circuit disconnected. The procedure is repeated until, with the disconnection of the fuse or breaker in the circuit which includes the receptacle in which the unit is connected, the relay is opened and the buzzer stops sounding, thereby identifying the circuit in which the receptacle is connected.

The unit may be operated in the reverse mode, i.e. to cause the buzzer to sound when power is applied to the relay rather than when it is removed, by placing the switch in the opposite position.

In a second disclosed embodiment the electrical cord is connected to the relay through an additional switching means, preferably a double-pole, double throw switch. When in a first position the cord leads are connected across the relay coil, as in the first embodiment, and the unit is used for circuit tracing as just described. When placed in a second position the cord is connected to terminals of the relay, rather than across the coil. Since no power is provided to the coil the relay switch is always in its de-energized position. The circuit between the battery and buzzer is completed, causing the buzzer to sound, through two conductors connected to the electrical cord leads and to one another. That is, when the second switch means is placed in its second position, circuit continuity between two conductors may be checked by connecting them to the leads of the electrical cord extending from the test device. If the conductors are in electrical communication, i.e. if there is circuit continuity, the battery is connected to the buzzer through the first and second switch means, the electrical cord and conductors, and the normally open contacts of the relay.

DETAILED DESCRIPTION

Figure 1:
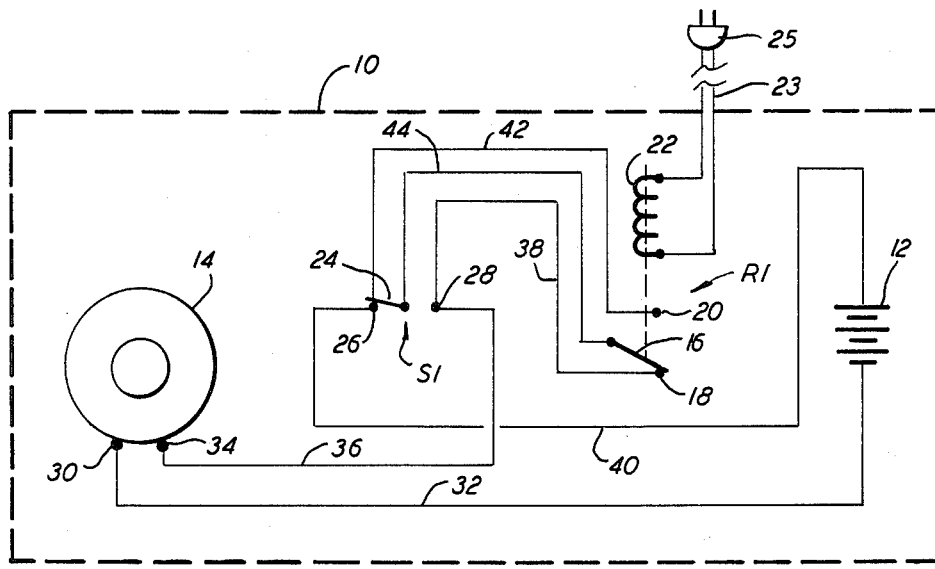
FIG. 1 is an electrical schematic of a first embodiment of the testing apparatus of the invention.

Referring now to the drawing, in FIG. 1 is shown a schematic diagram of test apparatus suitable for tracing an existing electrical circuit from a service outlet to a fuse or other circuit breaking point. Elements of the device are contained in a suitable box or housing indicated diagrammatically by dotted line 10. Such elements include one or more batteries 12 to provide a source of DC power (e.g., 6 volts), a buzzer 14, or other means for producing an audible sound when connected to the DC power source, switch S1 and relay R1. The latter includes switch member 16 movable from the position shown on normally closed contact 18 to normally open contact 20 in response to energization of the relay by providing AC power to coil 22. Leads extending from opposite sides of coil 22 are incorporated in a standard electrical cord 23 of any desired length extending from housing 10 and terminating in standard male plug 25. Switch S1, in the form shown, is a single pole, double throw switch having switch member 24 selectively movable between contacts 26 and 28.

Terminal 30 of buzzer 12 is connected by lead 32 to the negative side of battery 12. Buzzer terminal 34 is connected by lead 36 to switch S1 contact 28, which is connected by lead 38 to relay contact 18. The positive side of battery 12 is connected by lead 40 to switch S1 contact 26, which in turn is connected to normally open relay contact 20 by lead 42. Switching members 16 and 24 of relay R1 and switch S1 are connected to one another by lead 44. As shown in FIG. 1, with switch S1 in the position with member 24 on contact 26 and relay R1 de-energized, buzzer 12 will sound, being connected to the positive side of battery 12 through leads 36 and 38, relay switch member 16, lead 44, switch S1 switch member 24 and lead 40. When the relay is energized, i.e., when plug 25 is connected to a source of AC power, switch member 16 is moved to contact 20, thereby removing the contact of buzzer terminal 34 with the positive side of battery 12, and the buzzer ceases to sound.

For operation in the opposite mode, switch member 24 is moved to contact 28. In this position of switch S1, buzzer 14 is connected to the positive side of battery 12 and will sound when relay R1 is energized. When power is removed from plug 25 and coil 22, movement of switch member 16 back to normally closed contact 18, breaks the connection between the buzzer and battery.

Figure 2:
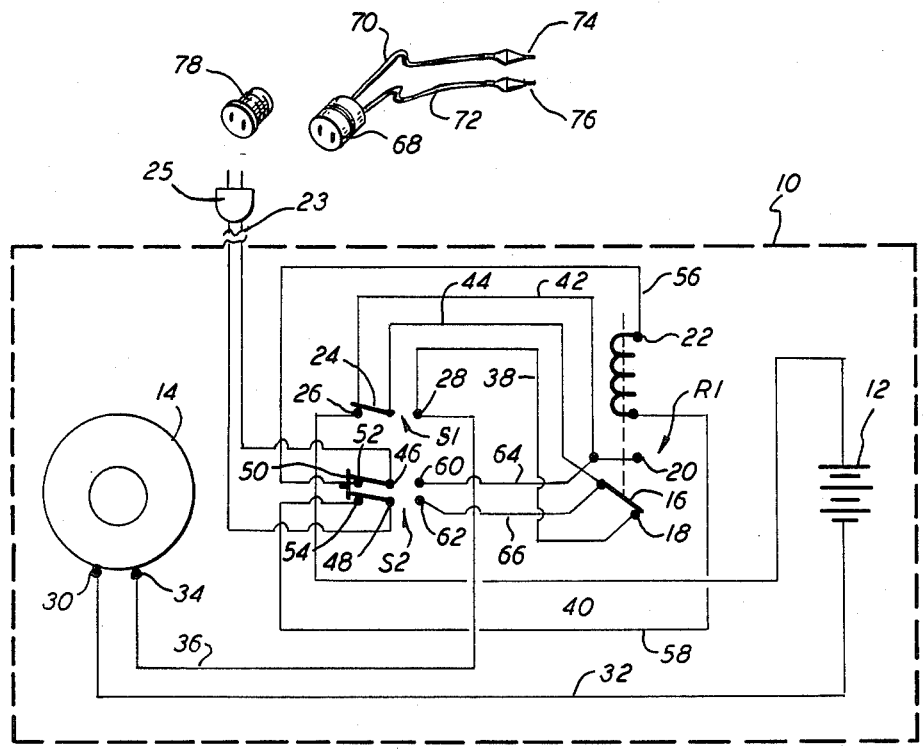
FIG. 2 is a schematic diagram of a second embodiment of the invention.

Turning now to the embodiment of FIG. 2, wherein elements common to the first embodiment are identified by the same reference numbers, a double pole-double throw switch S2 is added. The leads from electrical cord 23 and plug 25 are connected to terminals 46 and 48 of movable switch menber 50. When switch member 50 is in the position shown, terminals 46 and 48 are connected to contacts 52 and 54 which are connected by leads 56 and 58 to opposite ends of coil 22. Thus, in order to energize relay R1, switch S2 must be in the position shown in FIG. 2, whereby power may be supplied from an AC source through plug 25, cord 23, switch S2 and leads 56 and 58 to coil 22. Switch S1 may then be placed in either of its two positions and circuit tracing may be performed in the same way as previously described in connection with FIG. 1. That is, in the position shown, with switch member 24 on contact 26 (as also shown in FIG. 1), buzzer 14 will be connected to battery 12 and will sound as long as relay R1 remains de-energized, and will stop sounding when the relay is energized. If switch member 24 is moved to contact 28, the buzzer will sound when the relay is energized and will stop dounding when power is removed from coil 22. This operation is exactly the same as that of the FIG. 1 embodiment, coil 22 being connected to cord 23 through switch S2 rather than directly.

Placing switch S2 in the opposite position, i.e., with switch member 50 engaging contacts 60 and 62 provides an additional function, namely, determining whether or not two conductors are in electrical communication (circuit continuity) where neither conductor is connected to an electric power supply. Relay R1 will always remain de-energized when the testing device is used for continuity checking since there is no way to connect coil 22 to an AC power source with switch S2 in its alternate position. Switch S1 is also placed in the position alternate to that shown, with switch member 24 engaging contact 28 for continuity checking. With the testing device thus programmed by placing switches S1 and S2 in their alternate positions (opposite to those illustrated), buzzer 14 will sound when the circuit is completed through two conductors which are connected to the respective prongs of plug 25. That is, terminal 34 of the buzzer will be connected to the positive side of battery 12 through lead 36, contact 28, lead 38, contact 18, switch member 16, lead 66, switch S2, electrical cord 23, plug 25, the two communicating conductors connected to the plug prongs, back through switch S2 to lead 64, lead 42 and lead 40 to the battery. Thus, buzzer 14 will sound if two conductors contacted by the prongs of plug 25 are in circuit continuity, and will not sound if the conductors are not in continuity.

The performance of continuity checking may be simplified by providing a female receptacle 68 for receiving plug 25 and having leads 70 and 72 extending therefrom to terminate in so-called alligator clips 74 and 76. The latter may be engaged with the bare conductors being checked for circuit continuity, or when circuit tracing is performed through bare conductors rather than through a female receptacle which is directly wired into the circuit. Also, a standard threaded receptacle 78 may be provided as an additional accessory when it is necessary to connect the test device through an open, internally threaded socket.

If desired, an additional switch may be provided, for example, in the line connected to the positive side of the battery as an on/off switch for the entire device, but is not necessary for operation in the manner described. One or more fuses (not shown) of appropriate amperage would also be provided in conventional manner for proteting circuit components.

What is claimed is:

1. A lightweight, portable electrical circuit tester for temporary connection across a pair of conductors to determine whether AC power is present, said tester being selectively operable in either of two modes, providing an audible sound in response to absence of AC power when operated in a first mode and providing an audible sound in response to presence of AC power when operated in a second mode, said tester comprising, in combination:
   (a) a source of DC power (12);
   (b) means actuable to produce an audible sound (14) when electrically connected across said DC power source;
   (c) switch means (S1) including a switch member (24) selectively movable between electrical contact with either of first (26) and second (28) switch terminals, placing said tester in said first and second operational modes, respectively;
   (d) a pair of electrical leads (23);
   (e) means (25) for effecting temporary connection of said pair of leads across said pair of conductors;
   (f) relay means (R1) including a coil (22) and a movable contact (16) responsive to presence of AC power across said conductors, and thereby across said leads and said coil, for movement from a first (18) to a second (20) stationary relay contact; and
   (g) further electrical leads (32, 36, 38, 40, 42, 44) connecting said DC power source, sound producing means, switch means and relay means in a circuit configuration such that, when said tester is in said first operational mode (member 24 in contact with terminal 26) said DC power source is placed in activating connection with said sound producing means by absence of AC power across said coil, whereby said audible sound is produced only when no AC power is placed across said coil, and when said tester is in said second operational mode (member 24 in contact with terminal 28) said DC power source is placed in activating connection with said sound producing means by presence of AC power across said coil, whereby said audible sound is produced only when AC power is placed across said coil.

2. The invention according to claim 1 wherein said further electrical leads include a first lead (32) connecting one side of said sound producing means directly to one side of said DC power source.

3. The invention according to claim 2 wherein said further electrical leads include a second lead (44) connecting said switch member directly to said relay movable contact.

4. The invention according to claim 3 wherein said further electrical leads include leads (36, 38, 40, 42) connecting the other side of said sound producing means to the other side of said DC power source through said switch means and said relay means.

5. The invention according to claim 4 wherein said means for connecting said pair of leads to electrical contacts comprises a male plug (25) for insertion in a female receptacle.

6. The invention according to claim 1 wherein said pair of leads are connected directly across said coil (FIG. 1).

7. The invention according to claim 1 and further including additional switch means (52) having a second switch member (50) with a pair of arms to which said pair of leads are respectively connected, and selectively movable between a first position, in contact with a first pair of terminals (52,54) connected directly across said coil, and a second position, in contact with a second pair of terminals (60,62), one of which is connected to both said first switch terminal (26) and to said second relay contact (20), and the other of which is connected to both said relay movable contact (16) and to said switch member (24), whereby AC power may be provided to said relay coil only in said first position of said second switch member and circuit continuity between two conductors, neither of which is connected to an electrical power supply, may be determined with said second switch member in said second position (FIG. 2).

* * * * *